(12) United States Patent
Haase et al.

(10) Patent No.: US 6,922,073 B2
(45) Date of Patent: Jul. 26, 2005

(54) CIRCUIT CONFIGURATION FOR SIGNAL BALANCING IN ANTIPHASE BUS DRIVERS

(75) Inventors: Ordwin Haase, Taufkirchen (DE); Eric Pihet, München (DE)

(73) Assignee: Infineon Technologies AG, Munich (DE)

(*) Notice: Subject to any disclaimer, the term of this patent is extended or adjusted under 35 U.S.C. 154(b) by 53 days.

(21) Appl. No.: 10/698,063

(22) Filed: Oct. 30, 2003

(65) Prior Publication Data
US 2004/0124905 A1 Jul. 1, 2004

(30) Foreign Application Priority Data
Oct. 30, 2002 (DE) .......................... 102 50 576

(51) Int. Cl.[7] .................. H03K 19/003; H03K 17/16
(52) U.S. Cl. .................. 326/27; 326/30; 326/31; 326/86
(58) Field of Search .................. 326/26, 27, 30, 326/31, 83, 86

(56) References Cited

U.S. PATENT DOCUMENTS 5,448,180 A * 9/1995 Kienzler et al. .............. 326/15
6,154,061 A * 11/2000 Boezen et al. ................ 326/86

FOREIGN PATENT DOCUMENTS

WO 99/57810 11/1999

* cited by examiner

Primary Examiner—Daniel D. Chang
(74) Attorney, Agent, or Firm—Laurence A. Greenberg; Werner H. Stemer; Ralph E. Locher

(57) ABSTRACT

A circuit configuration for signal balancing in antiphase bus drivers, particularly for a CAN bus, which have, in each driver path of the bus, a driver amplifier unit and an output stage, driven by the latter, having a power transistor circuit for transmitting an antiphase signal using a two-wire line. A control circuit is connected to one of the driver paths and controls the turn-on resistance of the power transistor circuit in this driver path such that the power transistor circuits in the two driver paths have the same turn-on resistance.

16 Claims, 6 Drawing Sheets

CIRCUIT CONFIGURATION FOR SIGNAL BALANCING IN ANTIPHASE BUS DRIVERS

BACKGROUND OF THE INVENTION

Field of the Invention

The invention relates to a circuit configuration for signal balancing in antiphase bus drivers, particularly for a CAN bus. The bus drivers have, in each driver path of the bus, a driver amplifier unit and an output stage, driven by the latter, having a power transistor circuit.

In modern motor vehicles, it is frequently necessary for a plurality of control units, whose transmission rates typically range between 125 kBit/s and 1 MBit/s, to be able to communicate with one another. In this instance of application, the transmission rates need to be high enough for it to be possible to guarantee the demanded real-time response. The standardized antiphase symmetrical CAN (Controller Area Network) bus operates on the basis of the multimaster principle, where a plurality of control units having equal access authorization are connected to one another by the linear CAN bus structure.

The appended FIG. 6 shows a prior art bus driver circuit configuration (as currently used by Infineon Technologies AG of Germany, the assignee herein) with two antiphase driver paths I and II. The driver paths I and II, which are basically of symmetrical design, are routed from an input TxD and each have a driver amplifier unit TR1 and TR2, respectively, and a power transistor circuit, which comprises a PMOS power transistor M1, a diode D1 and a drain/source resistor R1 in driver path I, and which comprises a DMOS power transistor M2, a diode D2 and a drain/source resistor R2 in driver path II. In each driver path I and II, a voltage divider RSplit1 and RSplit2 forms a center voltage which is present at a node Split Term. On the output side, that is to say on the antiphase bus lines CANH and CANL, each driver path I and II contains terminating resistors $R_{term1}$ and $R_{term2}$, in each case between the bus line CANH and the bus line CANL and the node Split Term. It should be noted that the driver amplifier units TR1 and TR2 are inverting logic amplifiers which can be formed by corresponding inverter lines.

The first row in the signal graph shown in FIG. 7 shows the antiphase signal voltage profiles (U) on the bus line CANH and on the bus line CANL, respectively.

The bottom row in FIG. 7 shows that an asymmetry in the power transistor circuits, that is to say in the output stages of the bus drivers for the driver paths I and II, causes a common-mode offset or DC voltage offset $U_{offset}$ of, by way of example, 200 mV. As a result of this common-mode offset, the CAN line acts like a radiating antenna. The interference spikes (denoted by P0–P3) caused by the common-mode offset, such as arise at times T0–T3, can have undesirable consequences, particularly when the CAN bus is used in motor vehicles.

If the turn-on resistances of the power transistor circuits in the two driver paths I and II are the same size, then the common-mode offset illustrated in FIG. 7 does not exist. If the power transistor circuits are given the most accurate dimensions possible for the turn-on resistances, the common-mode offset can be eliminated. Since PMOS transistors and DMOS transistors do not change in the same way in the production process, however, there will always be a common-mode offset in practice when the driver circuit shown in FIG. 6 is used. It is possible to achieve a certain balance by trimming the resistors R1, R2 which are in series with the power transistors M1 and M2. This opportunity is severely limited, however, since the power transistors in the output stage are larger and the current-carrying capacity of the output stage is too severely restricted.

It will be understood that the PMOS transistor M1 is at least three times the size of the DMOS transistor M2 for the same power.

SUMMARY OF THE INVENTION

It is accordingly an object of the invention to provide a circuit configuration for signal balancing in antiphase bus drivers which overcomes the above-mentioned disadvantages of the heretofore-known devices and methods of this general type and which avoids the above-mentioned drawback of the common-mode offset by balancing the antiphase bus drivers.

With the foregoing and other objects in view there is provided, in accordance with the invention, a circuit configuration for signal balancing in an antiphase bus driver, which comprises:

first and second driver amplifier units respectively connected in each driver path of a bus carrying an antiphase signal on a two-wire line (e.g., a CAN bus);

an output stage for outputting the antiphase signal, the output stage having power transistor circuits respectively driven by the first and second driver amplifier units; and a control circuit connected only to one of the first and second driver amplifier units for controlling a turn-on resistance of the power transistor circuits and for setting the power transistor circuits in the two driver paths to have a mutually corresponding turn-on resistance.

In other words, the invention achieves the objects of the invention by virtue of one of the output stage transistors, preferably the DMOS transistor M2, being controlled such that an optimum $R_{on}$ ratio, namely the same $R_{on}$ ratio, is achieved.

Accordingly, an inventive circuit configuration for signal balancing in antiphase bus drivers, particularly for a CAN bus, which have, in each driver path of the bus, a driver amplifier unit and an output stage, driven by the latter, having a power transistor circuit for transmitting an antiphase signal using a two-wire line has a control circuit which is connected to one of the driver paths and controls the turn-on resistance of the power transistor circuit in this driver path such that the power transistor circuits in the two driver paths have the same turn-on resistance.

The turn-on resistance $R_{on}$ of the DMOS transistor is controlled by controlling the latter's gate voltage. In this context, the transistor's gate voltage can be controlled either directly or preferably indirectly by controlling the supply voltage for the driver amplifier unit which drives this DMOS power transistor.

In the exemplary embodiments of the inventive circuit configuration, the control circuit controls the supply voltage for the driver stage of the DMOS transistor. In a first exemplary embodiment, the control circuit has a simulation in the form of an antiphase internal bus driver which is constructed from components which each have the same degree of scaling smaller as the bus driver which is to be controlled. This internal bus driver has an internal pickup point at which the same signal magnitude becomes established as at the external node, which nominally carries the center value of the two antiphase signal voltages. This is the aforementioned node Split Term (FIG. 6). The control circuit then uses known circuit topologies to control the gate voltage.

In a second alternative exemplary embodiment, the measured value is picked up directly by a sample and hold circuit. The center voltage is measured and stored during the steady on-state. Further control is then effected as in the case of the first exemplary embodiment. As compared with the implementation proposed by the first exemplary embodiment, the second exemplary embodiment of the control circuit, which uses the sample and hold circuit, has the drawback that a relatively high level of circuit complexity is necessary. The advantage of using the sample and hold circuit is the increased accuracy for ascertaining the nominal controlled variable.

In accordance with an added feature of the invention, the power transistor circuit in a first driver path has a PMOS power transistor, and a second driver path has a DMOS power transistor. Preferably, the control circuit is connected to control the turn-on resistance of the DMOS power transistor. In particular, the control circuit controls the turn-on resistance by controlling a gate voltage for the DMOS power transistor.

In accordance with another feature of the invention, the control circuit controls the gate voltage for the DMOS power transistor by controlling the supply voltage for the driver amplifier unit that drives the DMOS power transistor.

In accordance with a further feature of the invention, the control circuit comprises an internal antiphase bus driver representing a simulation of the bus driver to be balanced. The internal antiphase bus driver has components with the same degree of scaling as the bus driver to be balanced, and the internal bus driver has an internal pickup node carrying a center voltage.

In accordance with a concomitant feature of the invention, the control circuit has a sample and hold circuit. In a steady on-state of the bus driver to be balanced, the sample and hold circuit measures and stores a center voltage of the bus driver.

Other features which are considered as characteristic for the invention are set forth in the appended claims.

Although the invention is illustrated and described herein as embodied in a circuit configuration for signal balancing in antiphase bus drivers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Before delving into the detailed description of the exemplary embodiments of a circuit configuration in accordance with the invention, it should be mentioned that the circuit is not limited to a CAN bus driver structure but rather can also be used for other symmetrical antiphase bus structures.

Figure 1:
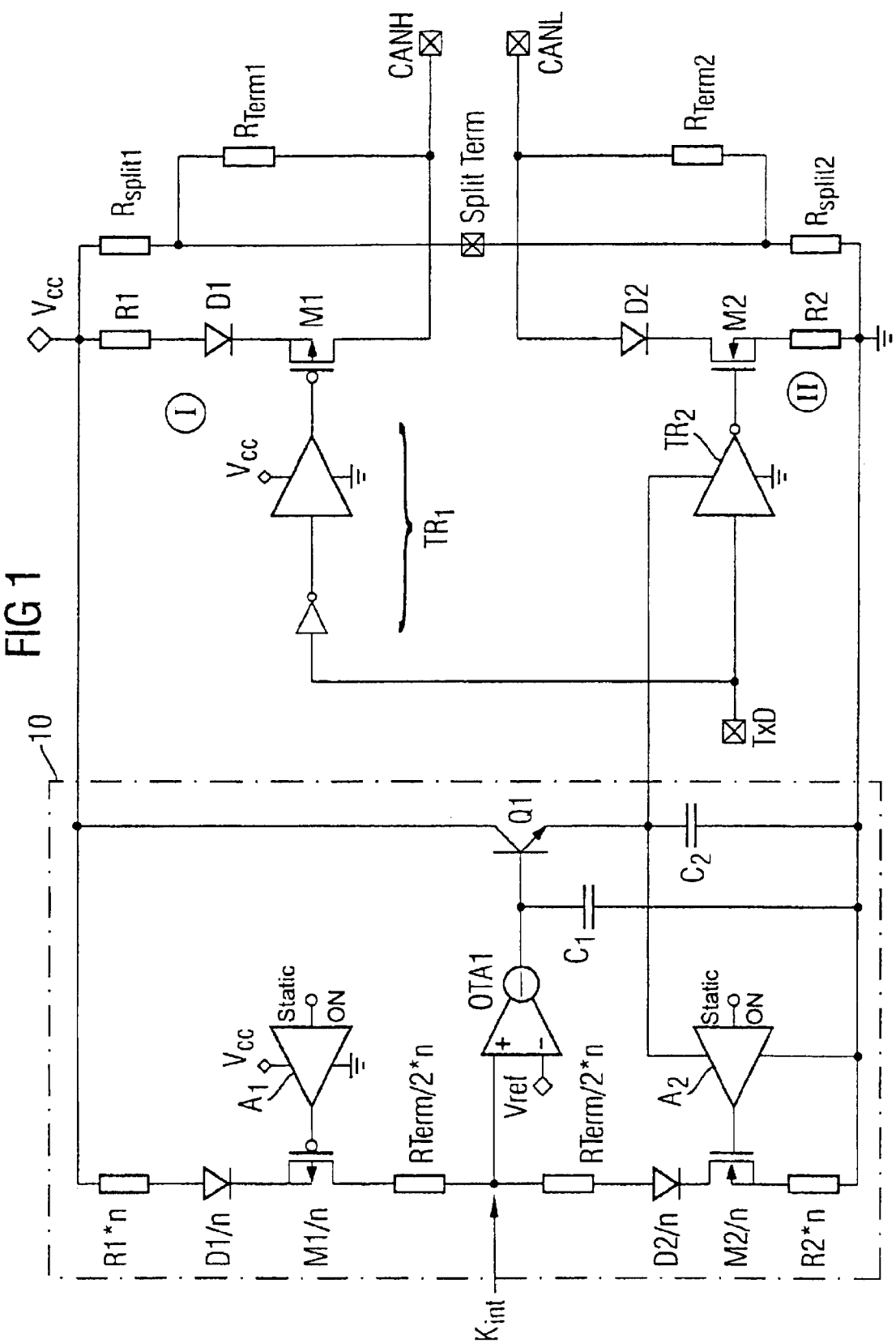
FIG. 1 is a circuit diagram for a circuit configuration for a first exemplary embodiment of the invention.
Figure 2:
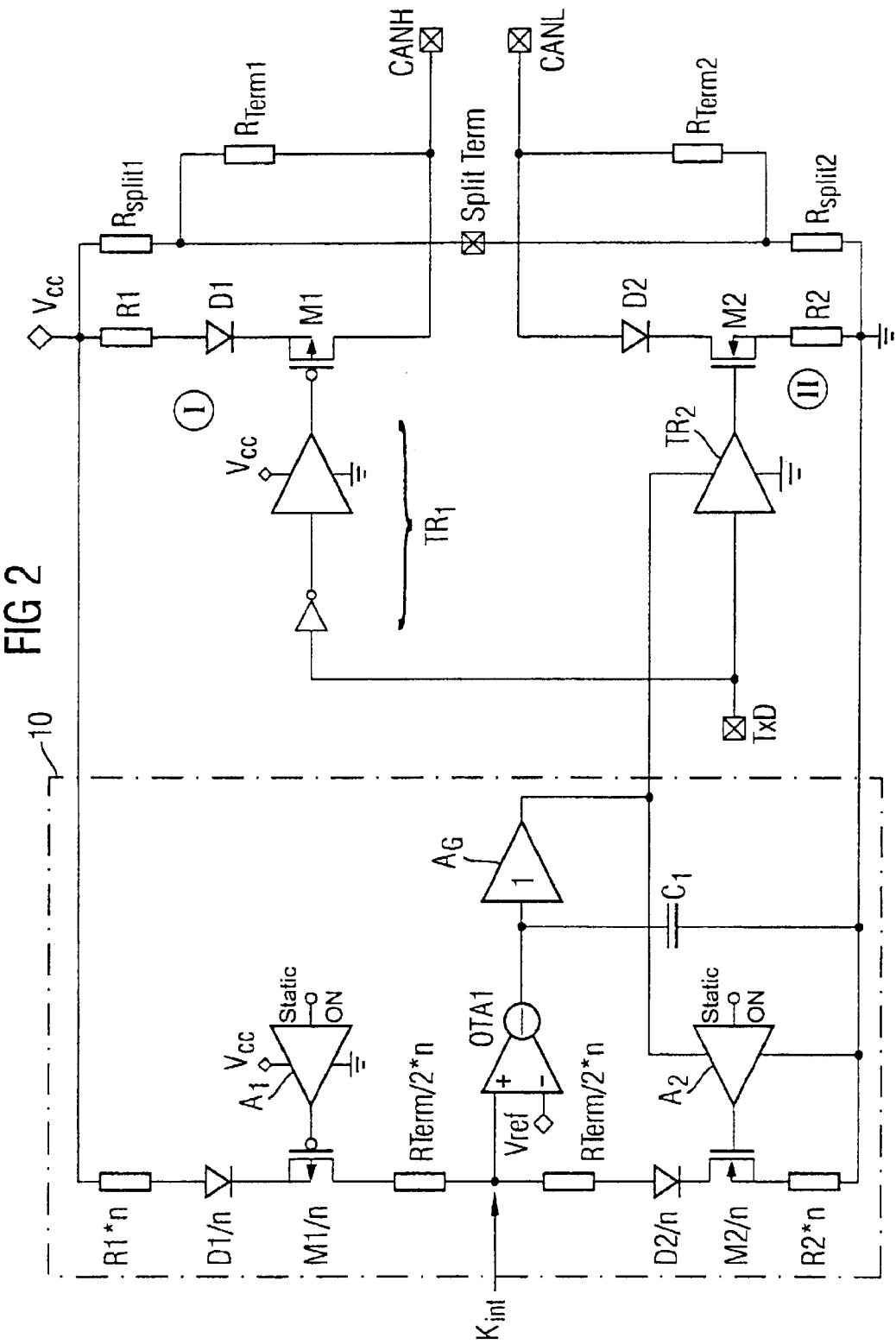
FIG. 2 is a circuit diagram for a first variant of the circuit configuration shown in FIG. 1.
Figure 3:
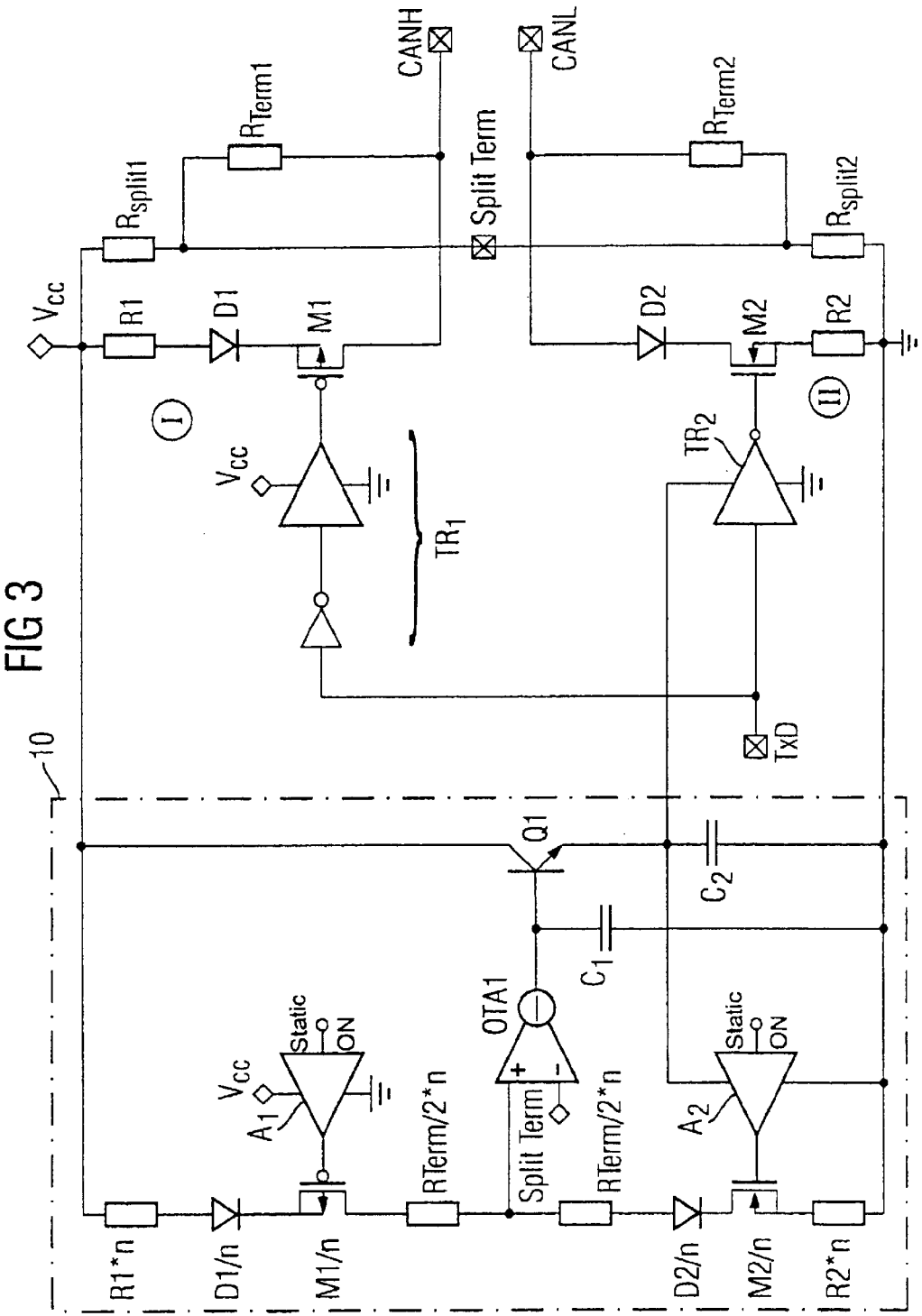
FIG. 3 is a circuit diagram for a second variant of the circuit configuration shown in FIG. 1.
Figure 6:
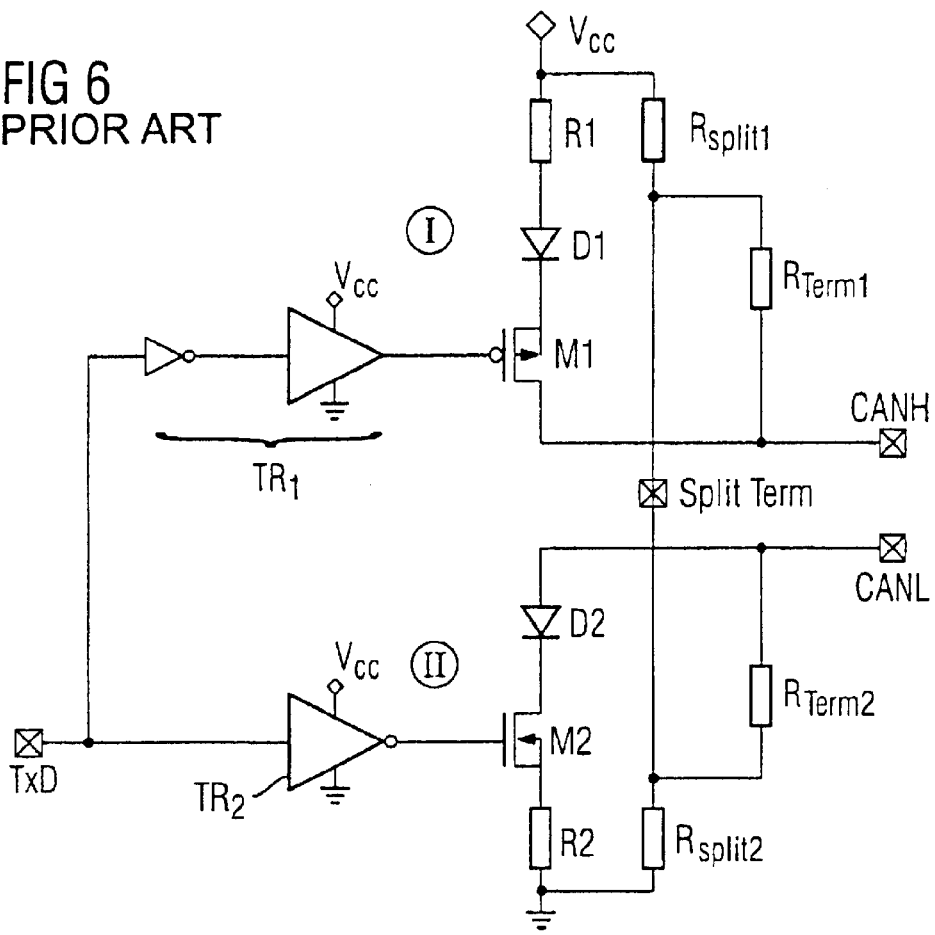
FIG. 6 shows a circuit diagram for a prior art CAN bus driver as described above.
Figure 7:
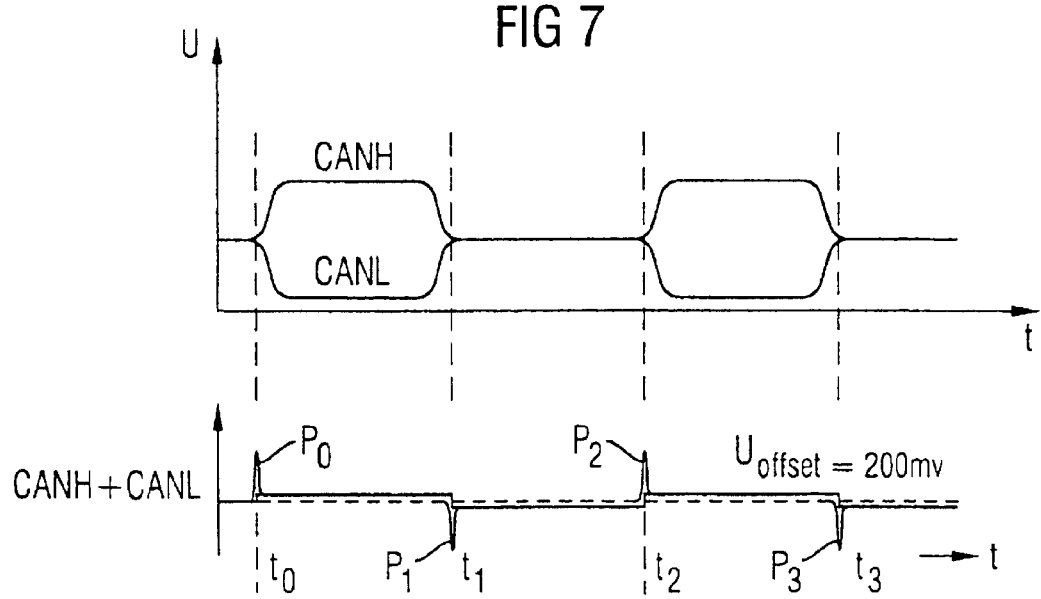
FIG. 7 is a graph showing the signal profiles for the CAN bus driver shown in FIG. 6, as described above.

Referring now to the figures of the drawing in detail and first, particularly, to FIG. 1 thereof, there is shown a first exemplary embodiment of an inventive circuit configuration for signal balancing for the antiphase bus drivers. As in FIG. 6, which is described above in the introductory text describing the prior art, the bus drivers are arranged in two driver paths I and II and have the same circuit configuration as in FIG. 6, which is therefore not repeated at this juncture. A control circuit 10 as shown in FIG. 1 controls the supply voltage for the driver amplifier unit TR2 in the second driver path II and hence the gate voltage for the DMOS power transistor M2. The control circuit 10 contains a simulation of the driver structures contained in the driver paths I and II, the values of the components in these driver structures each having the same ratio of scaling (reduced or enlarged values). In FIGS. 1 to 3, the letter n denotes the scaling ratio for the components in the internal bus drivers contained in the control circuit 10.

In driver path I, the power transistor M1/n and the diode D1/n in the control circuit 10 are respectively reduced in the ratio 1/n as compared with the PMOS power transistor M1 and the diode D1, while the resistor R1·n is larger than the resistor R1 by a factor of n. The same applies to the simulation of the internal bus driver in the driver path II. The PMOS transistor M1/n reduced by the factor 1/n has a static ON-signal applied to it via a driver amplifier simulation A1. The static ON-signal is turned off only when the supply voltage is disconnected. This driver amplifier simulation, like the driver amplifier TR1, is supplied by the supply voltage VCC. In a similar manner, the reduced DMOS power transistor M2/n receives a static ON-signal from a driver amplifier A1, whose supply voltage is controlled in the manner of that for the correct drive amplifier TR2, however. The two simulated power transistors M1/n and M2/n are connected by two series-connected simulated terminating resistors Rterm/2n whose mutual connection point forms an internal node $K_{int}$ at which the center voltage can be tapped off. An operational amplifier OTA1 is connected to this internal node $K_{int}$ by one input and receives a reference voltage $V_{ref}$ at its other input. The output of the operational amplifier OTA1 is connected to the base of a transistor Q1 whose emitter potential generates the control voltage, that is to say the supply voltage for the driver amplifier TR2 and the simulated driver amplifier A2. Two capacitors C1 and C2 are used to smooth this voltage.

FIG. 2 shows a variant of the circuit configuration shown in FIG. 1, where the output stage of the control circuit 10, which output stage is formed by the transistor Q1 in FIG. 1, has been replaced by a general buffer stage comprising a gain amplifier $A_G$ having a gain equal to 1. The further details of the circuit configuration in FIG. 2 are identical to those in FIG. 1.

FIG. 3 shows a further variation of the first exemplary embodiment (shown in FIG. 1) of the inventive circuit configuration, wherein the reference potential supplied to one input of the operational amplifier OTA1 is logically combined with the potential on the external node Split Term in the control circuit 10. The rest of the circuit configuration in FIG. 3 and its operation are identical to the configuration and operation of the circuit configuration shown in FIG. 1.

Figure 4:
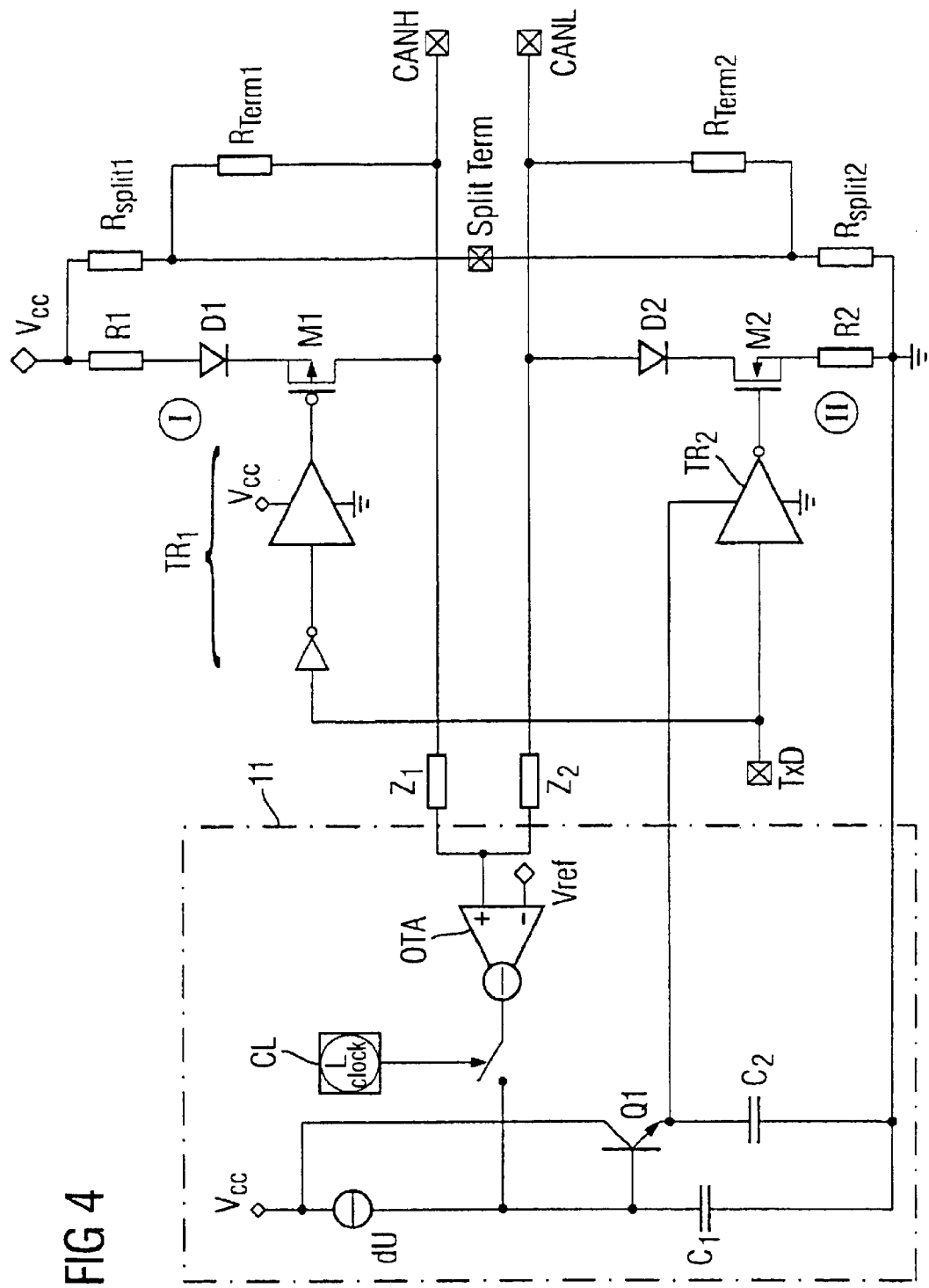
FIG. 4 is a circuit diagram for a second exemplary embodiment of a circuit configuration in accordance with the invention.

Referring now to FIG. 4, there is shown a second exemplary embodiment of the novel circuit configuration, wherein the control circuit (denoted by 11 in this case) has a sample and hold circuit which measures and stores the center voltage during the steady on-state of the bus driver. The center voltage is formed by balancing resistors Z1 and Z2, is amplified by an operational amplifier OTA. The amplified signal is used, under the clocking of the clock signal CL, to charge a capacitor C1. The charging voltage is of the capacitor C1 is used by a transistor Q1, in turn, as a control voltage for controlling the supply voltage for the driver amplifier TR2 and hence the gate voltage for the DMOS transistor M2.

Figure 5:
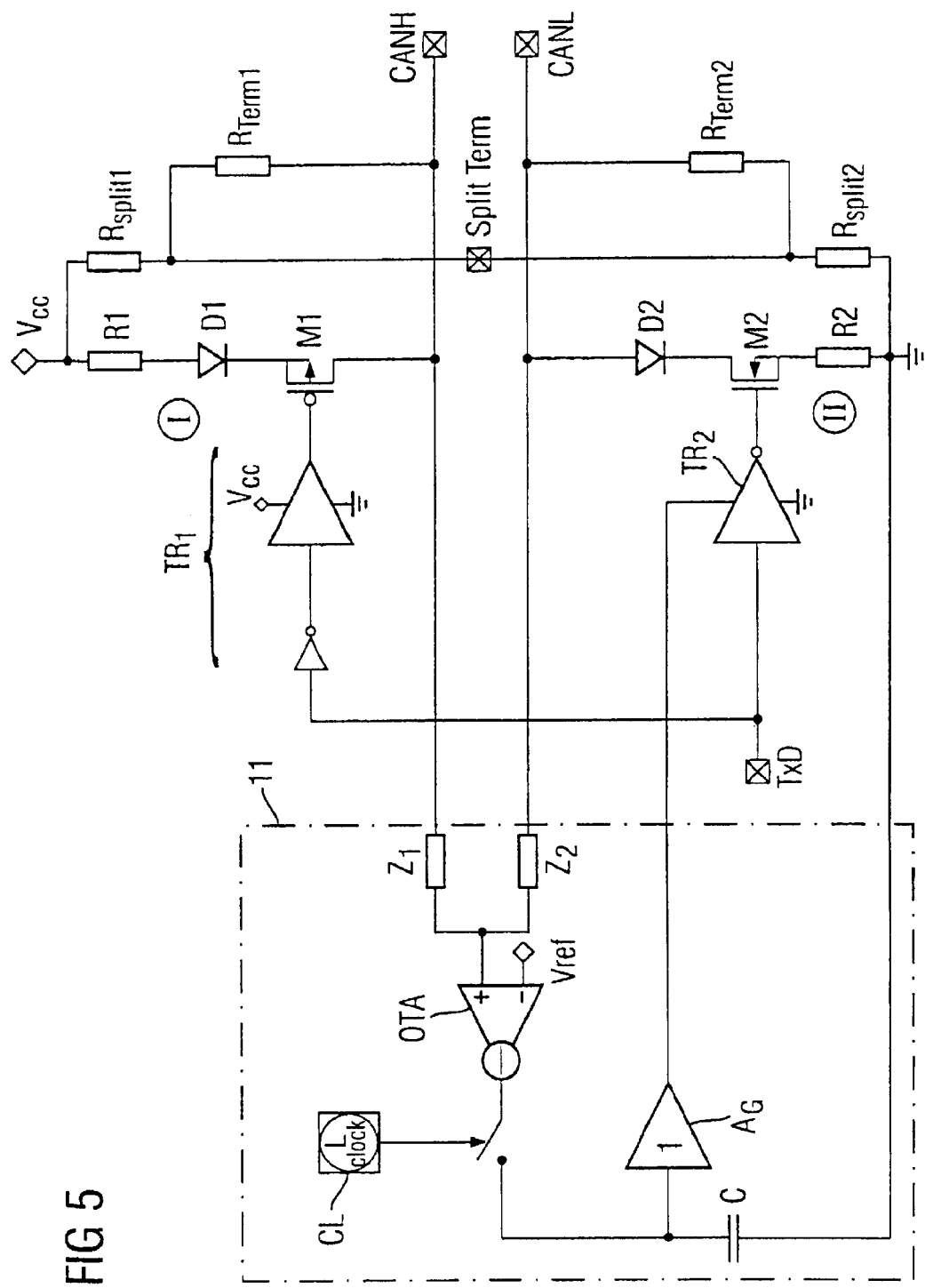
FIG. 5 is a circuit diagram of a variant of the second exemplary embodiment (shown in FIG. 4) of the circuit configuration in accordance with the invention.

The circuit configuration shown in FIG. 5 forms a variant of the second exemplary embodiment of the invention, described previously with reference to FIG. 4, wherein the output transistor Q1 has been replaced by a gain amplifier $A_G$ having a gain equal to 1. The rest of the circuit configuration, particularly the formation of the center voltage in the control circuit 11, is identical to that in FIG. 4.

The particular advantage of the second exemplary embodiment, which has just been described and is shown in FIGS. 4 and 5, of the inventive circuit configuration is the higher accuracy for picking up the nominal controlled variable. This requires increased circuit complexity for the sample and hold circuit as compared with the solutions based on the first exemplary embodiment.

The exemplary embodiments of the novel circuit configuration which have been described above and are shown in FIGS. 1 to 5 allow balancing of the antiphase bus drivers and, in particular, equality of the turn-on resistances of the two power transistors M1 and M2 in the two driver paths I and II, which means that the disturbing common-mode offset in the output signals on the bus lines CANH and CANL. As a result, the interference spikes are eliminated.

It should also be noted that the operational amplifiers denoted by OTA in FIGS. 1 to 5 are operational amplifiers having a transparent output, which therefore act as a current source.

We claim:

1. In a circuit configuration for signal balancing in antiphase bus drivers for a bus having two driver paths, the bus drivers having a driver amplifier unit and an output stage driven by the driver amplifier unit in each of the driver paths, the output stage having a power transistor circuit for transmitting an antiphase signal via a two-wire line, and a control circuit configured to control a turn-on resistance of the power transistor circuits such that the power transistor circuits have a same turn-on resistance in the two driver paths, wherein the improvement comprises:
the control circuit being connected to precisely one of the driver paths and controlling the turn-on resistance of the power transistor circuit in the respective driver path.

2. The circuit configuration according to claim 1, wherein the bus with the two driver paths is a CAN bus.

3. The circuit configuration according to claim 1, wherein the power transistor circuit in a first driver path has a PMOS power transistor, and a second driver path has a DMOS power transistor.

4. The circuit configuration according to claim 3, wherein said control circuit is connected to control the turn-on resistance of the DMOS power transistor.

5. The circuit configuration according to claim 4, wherein said control circuit is configured to control the turn-on resistance by controlling a gate voltage for the DMOS power transistor.

6. The circuit configuration according to claim 3, wherein said control circuit is configured to control a gate voltage for the DMOS power transistor by controlling a supply voltage for the driver amplifier unit driving the DMOS power transistor.

7. The circuit configuration according to claim 1, wherein said control circuit comprises an internal antiphase bus driver representing a simulation of the bus driver to be balanced, said internal antiphase bus driver having components with a same degree of scaling as the bus driver to be balanced, and said internal bus driver having an internal pickup node carrying a center voltage.

8. The circuit configuration according to claim 1, wherein said control circuit has a sample and hold circuit, and, in a steady on-state of the bus driver to be balanced, said sample and hold circuit measures and stores a center voltage of the bus driver.

9. A circuit configuration for signal balancing in an antiphase bus driver, which comprises:
first and second driver amplifier units respectively connected in each driver path of a bus carrying an antiphase signal on a two-wire line;
an output stage for outputting the antiphase signal, said output stage having power transistor circuits respectively driven by said first and second driver amplifier units; and
a control circuit connected only to one of said first and second driver amplifier units for controlling a turn-on resistance of said power transistor circuits and for setting the power transistor circuits in the two driver paths to have a mutually corresponding turn-on resistance.

10. The circuit configuration according to claim 9, wherein the bus with the two driver paths is a CAN bus.

11. The circuit configuration according to claim 9, wherein the power transistor circuit in one driver path has a PMOS power transistor, and the other driver path has a DMOS power transistor.

12. The circuit configuration according to claim 11, wherein said control circuit is connected to control the turn-on resistance of the DMOS power transistor.

13. The circuit configuration according to claim 12, wherein said control circuit is configured to control the turn-on resistance by controlling a gate voltage for the DMOS power transistor.

14. The circuit configuration according to claim 11, wherein said control circuit is configured to control a gate voltage for the DMOS power transistor by controlling a supply voltage for the driver amplifier unit driving the DMOS power transistor.

15. The circuit configuration according to claim 9, wherein said control circuit comprises an internal antiphase bus driver representing a simulation of the bus driver to be balanced, said internal antiphase bus driver having components with a same degree of scaling as the bus driver to be balanced, and said internal bus driver having an internal pickup node carrying a center voltage.

16. The circuit configuration according to claim 9, wherein said control circuit has a sample and hold circuit, and, in a steady on-state of the bus driver to be balanced, said sample and hold circuit measures and stores a center voltage of the bus driver.

* * * * *